US011922986B2

United States Patent
Yan et al.

(10) Patent No.: US 11,922,986 B2
(45) Date of Patent: Mar. 5, 2024

(54) MAGNETIC HETEROJUNCTION STRUCTURE AND METHOD FOR CONTROLLING AND ACHIEVING LOGIC AND MULTIPLE-STATE STORAGE FUNCTIONS

(71) Applicant: SHAN DONG UNIVERSITY, Jinan (CN)

(72) Inventors: Shishen Yan, Jinan (CN); Yufeng Tian, Jinan (CN); Lihui Bai, Jinan (CN); Yibo Fan, Jinan (CN); Xiang Han, Jinan (CN)

(73) Assignee: SHAN DONG UNIVERSITY, Jinan (CN)

( * ) Notice: Subject to any disclaimer, the term of this patent is extended or adjusted under 35 U.S.C. 154(b) by 182 days.

(21) Appl. No.: 17/645,215

(22) Filed: Dec. 20, 2021

(65) Prior Publication Data

US 2023/0148297 A1 May 11, 2023

(51) Int. Cl.
*G11C 11/16* (2006.01)
*G11C 11/18* (2006.01)
(Continued)

(52) U.S. Cl.
CPC ........ *G11C 11/161* (2013.01); *G11C 11/1675* (2013.01); *G11C 11/18* (2013.01);
(Continued)

(58) Field of Classification Search
CPC ... G11C 11/161; G11C 11/1675; G11C 11/18; G11C 11/5607; H10N 52/00;
(Continued)

(56) References Cited

U.S. PATENT DOCUMENTS 9,978,931 B2 * 5/2018 Hu .................. G11C 11/161
10,460,786 B2 * 10/2019 Lee .................. G11C 11/161
(Continued)

FOREIGN PATENT DOCUMENTS

| CN | 109411993 A | * | 3/2019 | |
|---|---|---|---|---|
| CN | 110044476 A | * | 7/2019 | ......... C23C 14/085 |
| CN | 113964627 A | * | 1/2022 | |

*Primary Examiner* — Ly D Pham
(74) *Attorney, Agent, or Firm* — CBM PATENT CONSULTING, LLC

(57) ABSTRACT

The present invention relates to a kind of magnetic heterojunction structure and the method of controlling and achieving spin logic and multiple-state storage functions. The said single magnetic heterojunction structure comprises the substrate, in-plane anti-ferromagnetic layer, in-plane ferromagnetic layer, nonmagnetic layer, vertical ferromagnetic layer, and vertical anti-ferromagnetic layer respectively from the bottom up; the said in-plane ferromagnetic layer and the said vertical ferromagnetic layer are coupled together through the said nonmagnetic layer in the middle; in-plane exchange biases, namely exchange biases in the plane, exist between the said in-plane ferromagnetic layer and the said in-plane anti-ferromagnetic layer, and out-of-plane exchange biases, namely exchange biases out of the plane, exist between the said vertical ferromagnetic layer and the said vertical anti-ferromagnetic layer.

12 Claims, 6 Drawing Sheets

(51) Int. Cl.
   | | |
   |---|---|
   | *G11C 11/56* | (2006.01) |
   | *H01F 10/32* | (2006.01) |
   | *H03K 19/18* | (2006.01) |
   | *H03K 19/20* | (2006.01) |
   | *H10N 50/85* | (2023.01) |
   | *H10N 52/00* | (2023.01) |
   | *H10N 52/80* | (2023.01) |

(52) U.S. Cl.
   CPC ...... *G11C 11/5607* (2013.01); *H01F 10/3254* (2013.01); *H01F 10/3268* (2013.01); *H03K 19/18* (2013.01); *H10N 50/85* (2023.02); *H10N 52/00* (2023.02); *H10N 52/80* (2023.02); *H03K 19/20* (2013.01)

(58) Field of Classification Search
   CPC .... H10N 52/80; H10N 50/85; H01F 10/3254; H01F 10/3268; H03K 19/18; H03K 19/20
   USPC ......................................................... 365/158
   See application file for complete search history.

(56) References Cited

U.S. PATENT DOCUMENTS

| | | | |
|---|---|---|---|
| 10,861,527 B2 * | 12/2020 | Lee | ........................ G11C 11/161 |
| 11,474,167 B1 * | 10/2022 | Wu | ........................ G01R 33/093 |
| 2019/0189908 A1 * | 6/2019 | Ebrahimi | ............... H10N 50/10 |
| 2019/0189912 A1 * | 6/2019 | Ebrahimi | ............... H10N 50/85 |

* cited by examiner

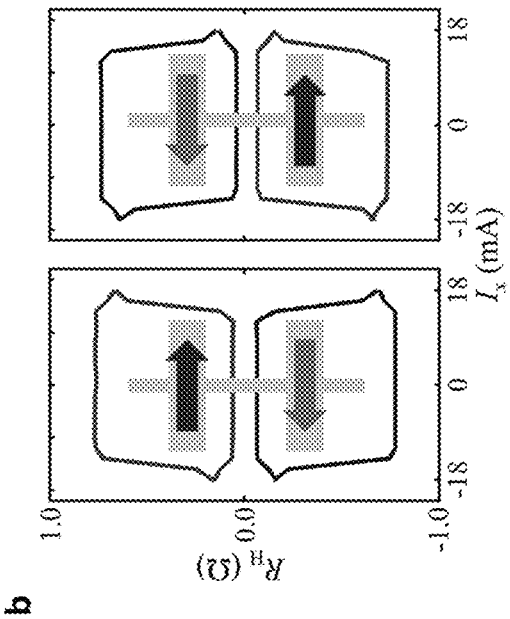
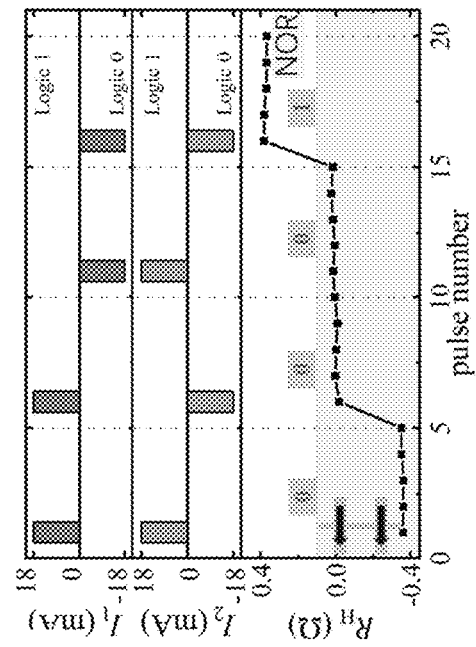
FIG. 4A
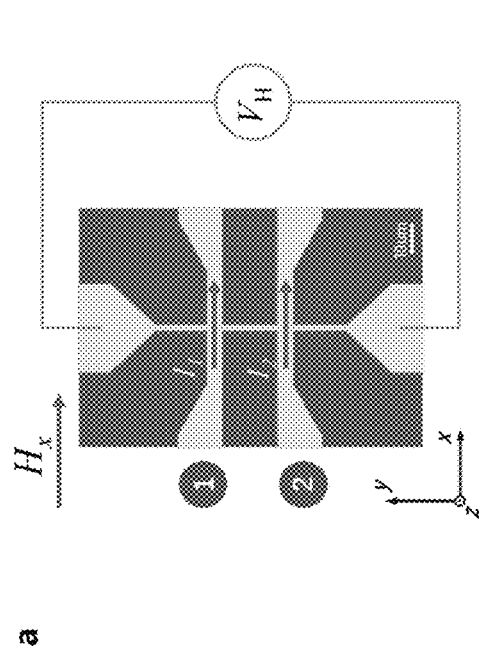
FIG. 4B
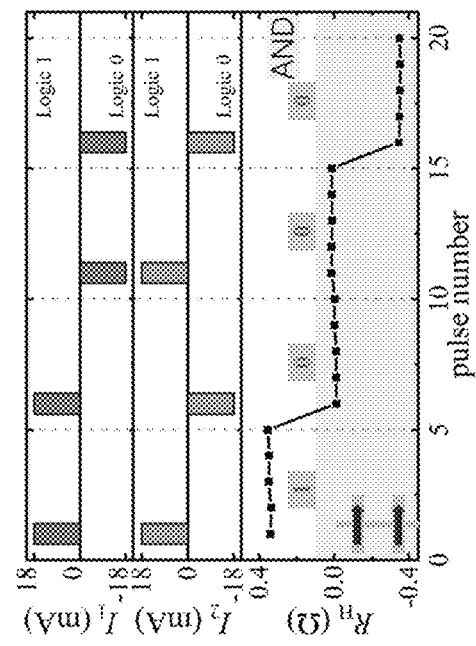
FIG. 4C
FIG. 4D

US 11,922,986 B2

MAGNETIC HETEROJUNCTION STRUCTURE AND METHOD FOR CONTROLLING AND ACHIEVING LOGIC AND MULTIPLE-STATE STORAGE FUNCTIONS

CROSS REFERENCES

This application claims priority to Chinese Patent Application Ser. No. 202111327449.5 filed 10 Nov. 2021.

FIELD OF THE INVENTION

The present invention relates to a single magnetic heterojunction structure with both out-of-plane exchange bias effect and in-plane exchange bias effect, as well as a method of achieving spin logic and multiple-state storage functions by adjusting and controlling the exchange biases in the two directions. It pertains to the field of data storage and logical operation in information technology.

BACKGROUND OF THE INVENTION

The exchange bias effect originates from the interfacial exchange coupling interaction between the ferromagnetic layer and the anti-ferromagnetic layer. Macroscopically, it is the offset of the magnetic hysteresis loop relative to zero fields. It has been widely used in giant magnetoresistance sensors, spin valves, and magnetic random access memories and plays an important role in spin electric devices. In recent years, as antiferromagnetic spintronics develop rapidly, a new craze has been started on studying the exchange bias effect. This is because findings have shown that the pinning layer materials commonly used in the exchange bias effect, namely antiferromagnetic materials such as IrMn and PtMn, can also produce spin currents that enable spin-orbit torque driven magnetization reversal in perpendicular magnetization systems without the need for any external field. For another, with the increasing applications of perpendicular magnetization structures in modern magnetic memories and magnetic tunnel junctions and the rapid progress of devices with hybrid out-of-plane and in-plane magnetic anisotropy (for example spin-Nano oscillators), more and more ferromagnetic layer materials with both in-plane and perpendicular magnetic anisotropy are needed in single device structures. To improve the heat stability of the devices with hybrid out-of-plane and in-plane magnetic anisotropy, single heterostructures with both in-plane exchange bias effect and out-of-plane exchange bias effect are urgently needed. Though coexistence of the in-plane exchange bias effect and out-of-plane exchange bias effect has been found in special ferromagnetic/antiferromagnetic/ferromagnetic trilayers and magnetic multilayer and, experimentally, attempts have been made to control the exchange bias effects in different ways, including thermal annealing, mechanical strain, magnetoelectric coupling, and spin-orbit torque, it is still impossible experimentally to control both in-plane exchange bias effect and out-plane exchange bias effect at the same time effectively in a single magnetic heterostructure so far. The effective control of the in-plane exchange bias effect and out-of-plane exchange bias effect at the same time in a single magnetic heterojunction can not only significantly expand the freedom of novel spintronic device design but also promote the research and development of three-dimensional multifunctional spintronic devices.

SUMMARY OF THE INVENTION

To address the drawbacks in the prior art, the present invention provides a single magnetic heterojunction structure with both in-plane exchange bias effect and out-of-plane exchange bias effect, as well as a method of achieving spin logic and multiple-state storage functions by adjusting and controlling the exchange biases in two directions in the said single magnetic heterojunction.

The present invention achieves the effective control of both in-plane exchange bias effect and out-of-plane exchange bias effect in a single magnetic heterostructure at the same time and obtains the prototype devices of multiple-state storage capability and spin logic based on such control.

Definition of Terms

Hallbar: It is used for Hall tests. By applying a constant current source to the two poles of the Hallbar and measuring the voltage on both sides under an external magnetic field, the Hall resistance, doping density, conduction type, and other properties of semiconductors can be determined.

A technical solution of the present invention is provided below:

a. A single magnetic heterojunction structure with both in-plane exchange bias effect and out-of-plane exchange bias effect, comprising of the substrate, in-plane anti-ferromagnetic layer, in-plane ferromagnetic layer, nonmagnetic layer, perpendicular ferromagnetic layer, and perpendicular anti-ferromagnetic layer respectively from the bottom up; the said in-plane ferromagnetic layer and the said perpendicular ferromagnetic layer are coupled together through the said nonmagnetic layer in the middle; in-plane exchange biases, namely exchange biases in the plane, exist between the said in-plane ferromagnetic layer and the said in-plane anti-ferromagnetic layer, and out-of-plane exchange biases, namely exchange biases out of the plane, exist between the said perpendicular ferromagnetic layer and the said perpendicular anti-ferromagnetic layer.

Preferably according to the present invention, the said in-plane anti-ferromagnetic layer can be any one of the antiferromagnetic materials IrMn, PtMn, PdMn, FeMn, CrMn, NiMn, NiO, CoO, MnO, FeO, and $Fe_2O_3$; the said perpendicular anti-ferromagnetic layer can be any one of the antiferromagnetic materials IrMn, PtMn, PdMn, FeMn, CrMn, NiMn, NiO, CoO, MnO, FeO, and $Fe_2O_3$; the said in-plane ferromagnetic layer is a kind of ferromagnetic material with in-plane magnetic anisotropy and can be any one of Co, Fe, Ni, CoFe, CoFeB, CoNi, NiFe, CoPt, CoTb, and FePt; the said perpendicular ferromagnetic layer is kind of ferromagnetic material with perpendicular magnetic anisotropy and can be any one of Co, Fe, Ni, CoFe, CoFeB, CoNi, NiFe, CoPt, CoTb, and FePt; the said nonmagnetic layer can be any one of Ta, Ru, Gd, Ti, W, Cr, Cu, Hf, Mo, Pd, Au, and Pt.

Preferably according to the present invention, the said in-plane anti-ferromagnetic layer is 1-20 nm thick; the said perpendicular anti-ferromagnetic layer is 1-20 nm thick; the said in-plane ferromagnetic layer is 0.5-10 nm thick; the said perpendicular ferromagnetic layer is 0.5-10 nm thick; the said nonmagnetic layer is 0.3-3 nm thick.

Most preferably, the said in-plane anti-ferromagnetic layer is IrMn and 8 nm thick; the said perpendicular anti-ferromagnetic layer is CoO and 6 nm thick; the said in-plane ferromagnetic layer is Co and 2 nm thick; the said perpendicular ferromagnetic layer is CoPt and 3.3 nm thick; the nonmagnetic layer is Ru and 0.8 nm thick.

More preferably, the said CoPt is a kind of composition-gradient ferromagnetic alloy and obtained by alternately sputtering several atomic layers of Co and Pt; the CoPt comprises 0.7 nm-thick Pt, 0.3 nm-thick Co, 0.5 nm-thick Pt, 0.5 nm-thick Co, 0.3 nm-thick Pt, and 1.0 nm-thick Co from the bottom up.

A method of adjusting and controlling the exchange biases in two directions to achieve the multiple-state storage capability in a single magnetic heterojunction, comprising steps as follows:

i. Current pulses and an external field are applied at the same time to set the in-plane exchange biases to a particular direction;

ii. Only current pulses are applied to adjust and control the perpendicular exchange biases through the spin-orbit torque effect without changing the direction of the in-plane exchange biases to achieve the multiple-state storage capability; the specific method is as follows: the spin arrangement mode of the interface between the perpendicular ferromagnetic layer and the perpendicular anti-ferromagnetic layer is adjusted and controlled through the amplitude control of the current pulses applied; different spin arrangement modes are generally associated to different Hall resistance values, and different Hall resistance states can be used to store different information, thus achieving multiple-state storage capability.

Preferably according to the present invention, in step (1), the value range of the external field $H_x$ is $-1000$ Oe$<H_x<-50$ Oe and $+50$ Oe$<H_x<+1000$ Oe; the value range of the pulse current $I_x$ is $-20$ mA$<I_x<-10$ mA and $+10$ mA$<H_x<+20$ mA, and the pulse current density is $10^6$-$10^7$ A/cm$^2$; both $H_x$ and $I_x$ are set along the length direction of the Hallbar.

More preferably, in step (1), the value range of the external field $H_x$ is $-100$ Oe$<H_x<-50$ Oe and $+50$ Oe$<H_x\leq+100$ Oe; the value range of the pulse current $I_x$ is $-19$ mA$\leq I_x<-12$ mA and $+12$ mA$<H_x\leq+19$ mA.

Preferably according to the present invention, the in-plane exchange biases and out-of-plane exchange biases can be set to different arrangement modes under the combined action of an external field pulse current to achieve non-volatile ten-state storage capability. The specific method is as follows:

1. Current pulses and an external field (external field $H_x$=+100 Oe; current pulses $I_x$=+19 mA) are applied at the same time to set the magnetic state of the in-plane ferromagnetic layer to the +x direction and the magnetic moments of the interface between the perpendicular ferromagnetic layer and the perpendicular anti-ferromagnetic layer to the +z direction, wherein the x direction is the length direction of the Hallbar and also the direction in which the current is applied; the y direction is the width direction of the Hallbar and also the direction in which the Hall voltage is tested; the z direction is the sample growth direction.

2. After the external field and current pulses applied in step A are removed, the current pulses $I_x$=+19 mA are applied, and the impulse strength of the write current pulses $I_x$ is adjusted to make $I_x$ fall between $-14$ mA and $-19$ mA; then, the out-of-plane anomalous Hall curve is measured, and a stable resistance state is obtained.

Step B is repeated nine times with varying pulse strength of the write-current pulses $I_x$ each time to obtain ten stable resistance states. These ten remanence states are used to represent 0 through 9 in decimal to achieve the non-volatile ten-state storage capability.

When step B is performed for the first time, the current pulses $I_x$=+19 mA are applied to obtain the first stable state, and then, a stable state is obtained each time when the step B is repeated. A total of ten stable states are obtained.

A method of achieving spin logic functions in a single magnetic heterojunction by controlling and adjusting the exchange biases in the two directions, comprising steps as follows:

① Hallbar device with two current channels but only one voltage channel is designed. The two current channels are the first channel and the second channel respectively.

② Current pulses and an external field are applied at the same time to set the direction of in-plane exchange biases in the first channel; then, the same procedures are followed to set the in-plane exchange biases in the second channel.

The alignment of magnetic moments in the first and second channels is controlled by controlling the directions of in-plane exchange biases and the directions and size of the input current pulses in the first and second channels. The specific method is as follows: first, the in-plane exchange biases in the first and second channels are set to different configurations during the logical operation; then, under zero field, different current pulses are input into the first and second channels as the logical inputs, and the Hall voltage or Hall resistance of the whole device is taken as the logical output to achieve the spin logic functions.

Preferably according to the present invention, in step ②, the process of achieving the AND logic function is as follows:

Current pulses and an external field (external field $H_x$=+100 Oe; current pulses $I_x$=+19 mA) are applied at the same time in the first and second channels to set the directions of in-plane exchange biases in the first and second channels and the magnetization direction of the in-plane ferromagnetic layer to the +x direction; then, the $R_H$-$I_x$ loops in the first and second channels flip anticlockwise. When the applied current pulses $I_x$=+18 mA, the magnetic moment of the perpendicular ferromagnetic layer in every single channel is upward; conversely, it is downward when the applied current pulses $I_x$=$-18$ mA. When $I_1$=$I_2$=+18 mA, namely when both logical inputs are "1" (where: $I_1$ and $I_2$ represent the current pulses applied in the first and second channels respectively), the magnetization directions of the perpendicular ferromagnetic layers in the first and second channels are both upward, and the corresponding logical output is "1", thus achieving the AND logic function.

Preferably according to the present invention, in step ②, the process of achieving the NOR logic function is as follows:

Current pulses and an external field (external field $H_x$=$-100$ Oe; current pulses $I_x$=+19 mA) are applied at the same time in the first and second channels to set the directions of in-plane exchange biases in the first and second channels and the magnetization directions of the in-plane ferromagnetic layers to the $-x$ direction; then, the $R_H$-$I_x$ loops in the first and second channels flip clockwise. When the applied current pulses $I_x$=+18 mA, the magnetic moment of the perpendicular ferromagnetic layer in every single channel is downward; conversely, it is upward when the applied current pulses $I_x$=$-18$ mA. When $I_1$=$I_2$=$-18$ mA, namely when both logical inputs are "0" (where: $I_1$ and $I_2$ represent the current pulses applied in the first and second channels respectively), the magnetization directions of the perpendicular ferromagnetic layers in the first and second channels are both upward, and the corresponding logical output is "1", thus achieving the NOR logic function.

Preferably according to the present invention, in step ②, the process of achieving the NIMP logic function is as follows:

Current pulses and an external field (external field $H_x=+100$ Oe; current pulses $I_1=+19$ mA) are applied in the first channel to set the direction of in-plane exchange biases in the first channel and the magnetization direction of the in-plane ferromagnetic layer to the +x direction;

Current pulses and an external field (external field $H_x=-100$ Oe; current pulses $I_2=+19$ mA) are applied in the second channel to set the direction of in-plane exchange biases in the second channel and the magnetization direction of the in-plane ferromagnetic layer to the -x direction;

Then, the $R_H$-$I_x$ loop in the first channel flips anticlockwise. When the applied current pulses $I_1=+18$ mA, the magnetic moment of the perpendicular ferromagnetic layer in the first channel is upward; conversely, it is downward when the applied current pulses $I_1=-18$ mA.

The $R_H$-$I_x$ loop in the second channel flips clockwise. When the applied current pulses $I_2=+18$ mA, the magnetic moment of the perpendicular ferromagnetic layer in the second channel is downward; conversely, it is upward when the applied current pulses $I_2=-18$ mA.

Therefore, when the input of the first channel is "1", namely $I_1=+18$ mA, and the input of the second channel is "0", namely $I_2=-18$ mA, the magnetization directions of the perpendicular ferromagnetic layers in the first and second channels are both upward, and the corresponding logical output is "1", thus achieving the NIMP logic function.

Preferably according to the present invention, in step ②, the process of achieving the Converse NIMP logic function is as follows:

Current pulses and an external field (external field $H_x=-100$ Oe; current pulses $I_1=+19$ mA) are applied in the first channel to set the direction of in-plane exchange biases in the first channel and the magnetization direction of the in-plane ferromagnetic layer to the -x direction;

Current pulses and an external field (external field $H_x=+100$ Oe; current pulses $I_2=+19$ mA) are applied in the second channel to set the direction of in-plane exchange biases in the second channel and the magnetization direction of the in-plane ferromagnetic layer to the +x direction;

Then, the $R_H$-$I_x$ loop in the first channel flips clockwise. When the applied current pulses $I_1=+18$ mA, the magnetic moment of the perpendicular ferromagnetic layer in the first channel is downward; conversely, it is upward when the applied current pulses $I_1=-18$ mA.

The $R_H$-$I_x$ loop in the second channel flips anticlockwise. When the applied current pulses $I_2=+18$ mA, the magnetic moment of the perpendicular ferromagnetic layer in the second channel is upward; conversely, it is downward when the applied current pulses $I_2=-18$ mA.

Therefore, when the input of the first channel is "0", namely $I_1=-18$ mA, and the input of the second channel is "1", namely $I_2=+18$ mA, the magnetization directions of the perpendicular ferromagnetic layers in the first and second channels are both upward, and the corresponding logical output is "1", thus achieving the Converse NIMP logic function.

Beneficial Effects of the Present Invention

The effective control of the in-plane exchange bias effect and out-of-plane exchange bias effect at the same time in a single magnetic heterojunction can not only significantly expand the freedom of novel spintronic device design but also promote the research and development of three-dimensional multifunctional spintronic devices.

BRIEF DESCRIPTION OF THE DRAWINGS

FIG. 4A is the schematic diagram of Hall bar device;

FIG. 4B is the opposite (clockwise or counterclockwise) polarity of the magnetic moment flipping under the drive of the spin-orbit torque in both channels;

FIG. 4C is the schematic diagram of achieving logic functions through exchange bias controlling and adjusting (the AND logic function);

FIG. 4D is the schematic diagram of achieving logic functions through exchange bias controlling and adjusting (the NOR logic function);

EMBODIMENTS

Figure 1A:
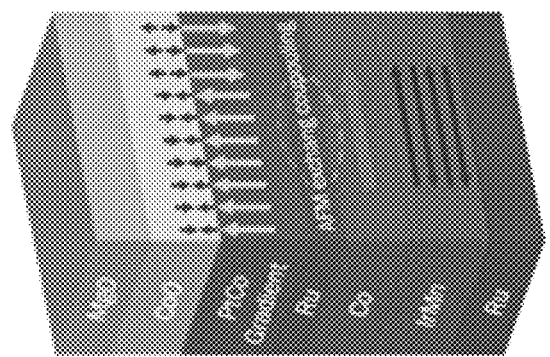
FIG. 1A is the schematic diagram of the structure of a single magnetic heterojunction in the present invention.

The present invention is further described as follows with reference to the embodiments and drawings. However, the present invention is not limited thereto.

Embodiment 1

A single magnetic heterojunction structure with both in-plane exchange bias effect and out-of-plane exchange bias effect, comprising of the substrate, in-plane anti-ferromagnetic layer, in-plane ferromagnetic layer, nonmagnetic layer, perpendicular ferromagnetic layer (out-of-plane ferromagnetic layer), and perpendicular anti-ferromagnetic layer (out-of-plane anti-ferromagnetic layer) respectively from the bottom up; the said in-plane ferromagnetic layer and the said perpendicular ferromagnetic layer are coupled together through the said nonmagnetic layer in the middle;

in-plane exchange biases, namely exchange biases in the plane, exist between the said in-plane ferromagnetic layer and the said in-plane anti-ferromagnetic layer, and out-of-plane exchange biases, namely exchange biases out of the plane, exist between the said perpendicular ferromagnetic layer and the said perpendicular anti-ferromagnetic layer.

The structural features of the said single magnetic heterojunction comprise: (1) In-plane exchange biases, namely exchange biases in the plane, exist between the said in-plane ferromagnetic layer and the said in-plane anti-ferromagnetic layer. (2) Out-of-plane exchange biases, namely exchange biases out of the plane, exist between the said perpendicular ferromagnetic layer and the said perpendicular anti-ferromagnetic layer. (3) The said in-plane ferromagnetic layer and the said perpendicular ferromagnetic layer are coupled by the interlayer exchange. (4) With the help of the interlayer coupling effect, spin currents generated by the perpendicular magnetic layers themselves or the nonmagnetic layers can drive the magnetic moments of the perpendicular magnetic layers to flip through the spin-orbit torque effect.

Embodiment 2

The said single magnetic heterojunction structure with both in-plane exchange bias effect and out-of-plane exchange bias effect according to Embodiment 1, provided however that:

The said in-plane anti-ferromagnetic layer can be any one of the antiferromagnetic materials IrMn, PtMn, PdMn, FeMn, CrMn, NiMn, NiO, CoO, MnO, FeO, and $Fe_2O_3$; the said perpendicular anti-ferromagnetic layer can be any one of the antiferromagnetic materials IrMn, PtMn, PdMn, FeMn, CrMn, NiMn, NiO, CoO, MnO, FeO, and $Fe_2O_3$; the said in-plane ferromagnetic layer is a kind of ferromagnetic material with in-plane magnetic anisotropy and can be any one of Co, Fe, Ni, CoFe, CoFeB, CoNi, NiFe, CoPt, CoTb, and FePt; the said perpendicular ferromagnetic layer is a kind of ferromagnetic material with perpendicular magnetic anisotropy and can be any one of Co, Fe, Ni, CoFe, CoFeB, CoNi, NiFe, CoPt, CoTb, and FePt; the said nonmagnetic layer can be any one of Ta, Ru, Gd, Ti, W, Cr, Cu, Hf, Mo, Pd, Au, and Pt.

The said in-plane anti-ferromagnetic layer is 1-20 nm thick; the said perpendicular anti-ferromagnetic layer is 1-20 nm thick; the said in-plane ferromagnetic layer is 0.5-10 nm thick; the said perpendicular ferromagnetic layer is 0.5-10 nm thick; the said nonmagnetic layer is 0.3-3 nm thick.

Embodiment 3

The said single magnetic heterojunction structure with both in-plane exchange bias effect and out-of-plane exchange bias effect according to Embodiment 1, provided however that:

As shown in FIG. 1A, the said in-plane anti-ferromagnetic layer is IrMn and 8 nm thick; the said perpendicular anti-ferromagnetic layer is CoO and 6 nm thick; the said in-plane ferromagnetic layer is Co and 2 nm thick, wherein the Co has in-plane magnetic anisotropy and can produce in-plane exchange biases at the IrMn/Co interface; the said perpendicular ferromagnetic layer is CoPt and 3.3 nm thick, wherein the CoPt alloy has perpendicular magnetic anisotropy and can produce out-of-plane exchange biases at the CoPt/CoO interface; the nonmagnetic layer is Ru and 0.8 nm thick.

The said single magnetic heterojunction structure is prepared based on the Si/$SiO_2$ substrate with a magnetron sputtering device; then, it is annealed for one hour under 250° C. and a 5000 Oe in-plane field.

The said CoPt is a kind of composition-gradient ferromagnetic alloy and obtained by alternately sputtering several atomic layers of Co and Pt; the CoPt comprises 0.7 nm-thick Pt, 0.3 nm-thick Co, 0.5 nm-thick Pt, 0.5 nm-thick Co, 0.3 nm-thick Pt, and 1.0 nm-thick Co from the bottom up.

A Hallbar structure with a length of 70 μm and a width of 5 μm is fabricated by photoetching and argon ion etching, wherein the Hall voltage measurement channel is 2 μm wide.

FIG. 2A-D illustrates the results of adjusting and controlling the in-plane exchange biases and out-of-plane exchange biases simultaneously in a single magnetic heterojunction.

First, the field is set as $H_x = \pm 100$ Oe, and a single current pulse $I_x = \pm 19$ mA is applied.

Then, the field is set as $H_x = 0$ Oe, and the $R_H$-$H_z$ loop and the $R_H$-$I_x$ loop are measured. Among them, the in-plane exchange biases and the magnetization direction of the in-plane ferromagnetic layer Co can be measured through the polarity of the magnetic moment flipping under the drive of the spin-orbit torque ($R_H$-$I_x$ loop), while the out-of-plane exchange biases are measured through anomalous Hall effect ($R_H$-$H_z$ loop).

Figures 2A, 2B:
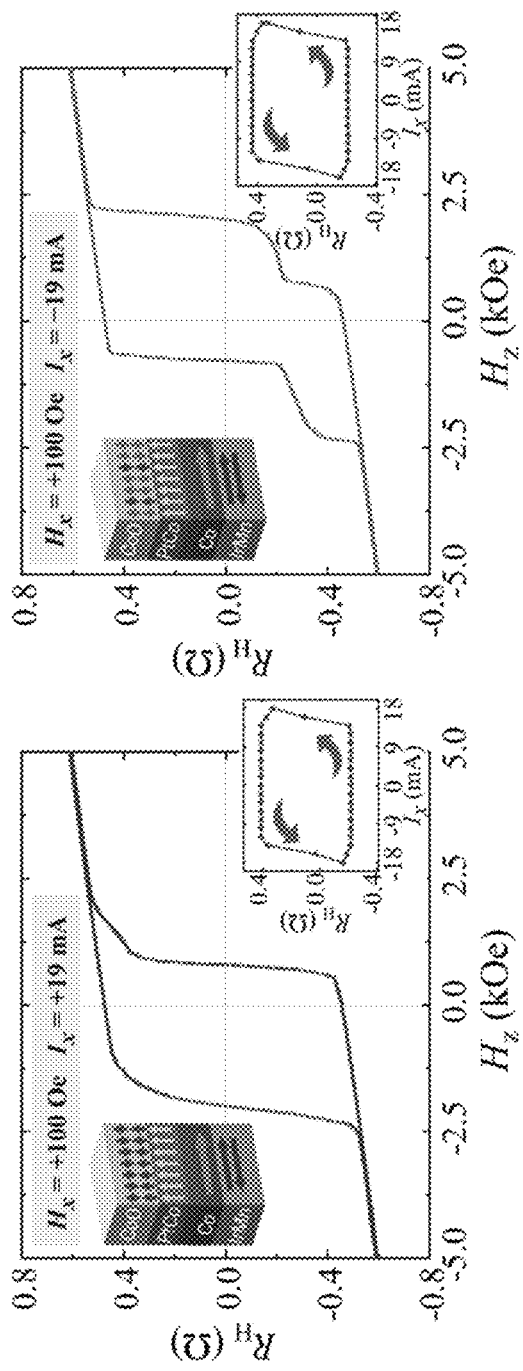
FIG. 2A is the schematic diagram of controlling and adjusting the in-plane and out-of-plane exchange biases at the same time through current pulses and a magnetic field ($H_x=+100$ Oe, $I_x=+19$ mA)
FIG. 2B is the schematic diagram of controlling and adjusting the in-plane and out-of-plane exchange biases at the same time through current pulses and a magnetic field ($H_x=+100$ Oe, $I_x=-19$ mA)
Figures 2C, 2D:
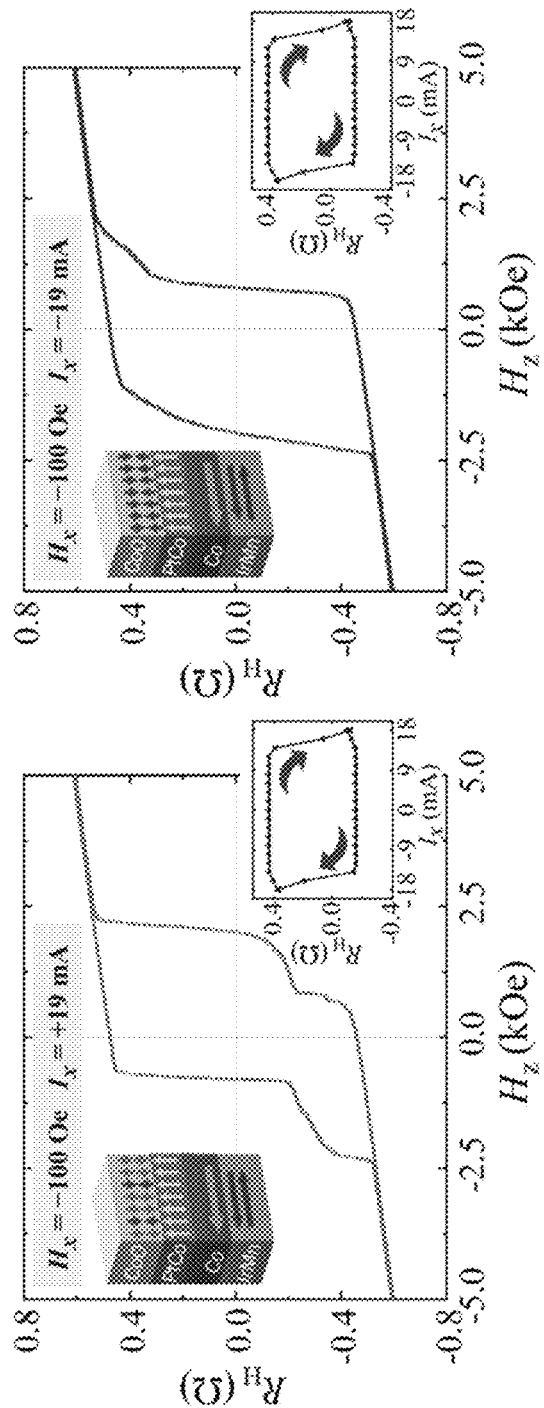
FIG. 2C is the schematic diagram of controlling and adjusting the in-plane and out-of-plane exchange biases at the same time through current pulses and a magnetic field ($H_x=-100$ Oe, $I_x=+19$ mA)
FIG. 2D is the schematic diagram of controlling and adjusting the in-plane and out-of-plane exchange biases at the same time through current pulses and a magnetic field ($H_x=-100$ Oe, $I_x=-19$ mA)

FIG. 2A-D shows the measurement results under 200K when different $H_x$ and $I_x$ are applied respectively. The conditions applied are as follows:

a: $H_x = +100$ Oe, $I_x = +19$ mA (as shown in FIG. 2A);
b: $H_x = +100$ Oe, $I_x = -19$ mA (as shown in FIG. 2B);
c: $H_x = -100$ Oe, $I_x = +19$ mA (as shown in FIG. 2C);
d: $H_x = -100$ Oe, $I_x = -19$ mA (as shown in FIG. 2D).

As can be seen from FIG. 2A and FIG. 2B, when $H_x = +100$ Oe is applied, the polarity of the $R_H$-$I_x$ loop is always anticlockwise despite the direction of the current, which means that the magnetization direction of the in-plane ferromagnetic layer Co is always in the +x direction, and the effective field supplied to the perpendicular ferromagnetic layer CoPt by the interlayer antiferromagnetic exchange coupling effect is always in the −x direction. When $H_x = +100$ Oe but current pulses of different directions are applied, the $R_H$-$H_z$ loop varies significantly. Particularly, when the current pulses are applied in the +x direction, the $R_H$-$H_z$ loop is observed with a bias toward the −z direction; conversely, the loop has a bias toward the +z direction when the current pulses are applied in the −x direction. For another, once $H_x = -100$ Oe and $I_x = \pm 19$ mA are applied, the $R_H$-$I_x$ loop that flips clockwise is obtained, which indicates that the magnetization direction of the in-plane ferromagnetic layer Co is always in the −x direction. However, in this case, the $R_H$-$H_z$ loop has a significant bias toward the +z direction (as shown in FIG. 2C) when $I_x = +19$ mA and a significant bias toward the −z direction when $I_x = -19$ mA (as shown in FIG. 2D).

To sum up, when current pulses and an external field are applied at the same time, the in-plane exchange bias direction is along the direction of the applied external field, and the out-of-plane exchange bias direction is decided by the relative direction between the external field and the current pulses. When the external field and the current pulses are applied in the same direction (as shown in FIG. 2A and FIG. 2D), the resulting $R_H$-$H_z$ loop has a bias toward the −z direction, namely the out-of-plane exchange bias is positive; when the external field and the current pulses are applied in opposite directions (as shown in FIG. 2B and FIG. 2C), the resulting $R_H$-$H_z$ loop has a bias toward the +z direction, namely the out-of-plane exchange bias is negative. As shown in FIG. 2A-D, the effective control of the in-plane exchange bias and out-of-plane exchange bias can be achieved through control of the directions of the external field and the current pulses to obtain four kinds of exchange bias arrangement modes.

Embodiment 4

A method of adjusting and controlling the exchange biases in two directions to achieve multiple-state storage capability in the said single magnetic heterojunction according to any one of the Embodiments 1-3, wherein a Hallbar structure with a length of 70 μm and a width of 5 μm is fabricated by photoetching and argon ion etching, and the Hall voltage measurement channel is 2 μm wide, comprising steps as follows:
  i. Current pulses and an external field are applied at the same time to set the in-plane exchange biases to a particular direction;
  ii. Only current pulses are applied to adjust and control the perpendicular exchange biases through the spin-orbit torque effect without changing the direction of the in-plane exchange biases to achieve multiple-state storage; the specific method is as follows: the spin arrangement mode of the interface between the perpendicular ferromagnetic layer and the perpendicular anti-ferromagnetic layer is adjusted and controlled through the amplitude control of the current pulses applied; different spin arrangement modes are generally associated to different Hall resistance values, and different Hall resistance states can be used to store different information, thus achieving multiple-state storage capability.

Therefore, by changing the amplitude of the applied current pulses, different Hall resistance states can be obtained, and different Hall resistance states can be used to store different information.

Figure 1B:
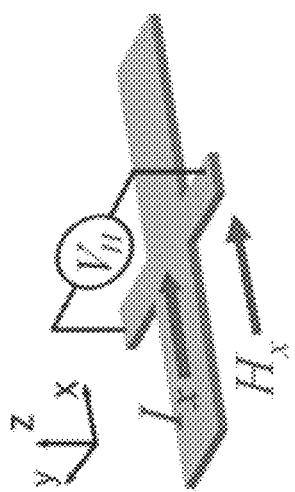
FIG. 1B is the schematic diagram of the electric transportation measurement of a single magnetic heterojunction in the present invention.

In step (1), the value range of the external field $H_x$ is $-1000\ Oe < H_x < -50\ Oe$ and $+50\ Oe < H_x < +1000\ Oe$; the value range of the pulse current $I_x$ is $-20\ mA < I_x < -10\ mA$ and $+10\ mA < H_x < +20\ mA$, and the pulse current density is $10^6$-$10^7$ A/cm$^2$; both $H_x$ and $I_x$ are set along the length direction of the Hallbar, as shown in FIG. 1(b), wherein the positive direction is denoted by "+" and the negative direction is denoted by "−".

Embodiment 5

The method of adjusting and controlling the exchange biases in two directions to achieve multiple-state storage capability in a single magnetic heterojunction according to Embodiment 4, provided however that: In step (1), the value range of the external field $H_x$ is $-100\ Oe \leq H_x < -50\ Oe$ and $+50\ Oe < H_x \leq +100\ Oe$; the value range of the pulse current $I_x$ is $-19\ mA \leq I_x < -12\ mA$ and $+12\ mA < H_x \leq +19\ mA$.

Embodiment 6

Figures 3A, 3B:
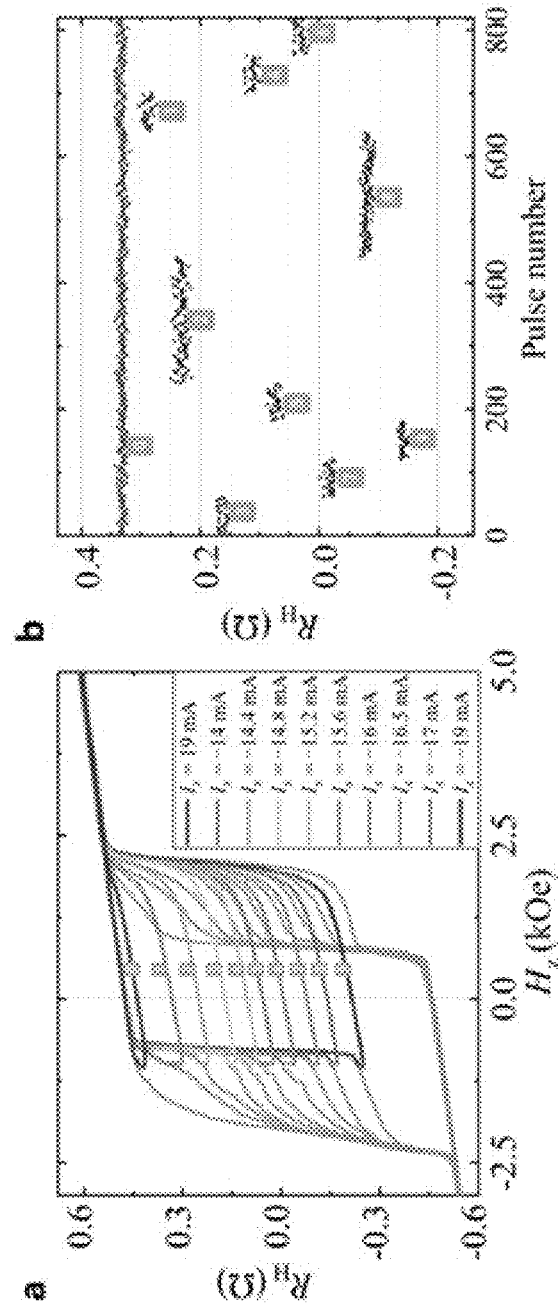
FIG. 3A is the schematic diagram of achieving multiple-state storage through controlling the strength of the current pulses (the out-of-plane anomalous Hall curve is measured)
FIG. 3B is the schematic diagram of achieving multiple-state storage through controlling the strength of the current pulses (each of the 0-9 state is measured 30 or 100 times)

A method of adjusting and controlling the exchange biases in two directions to achieve the multiple-state storage capability in the said single magnetic heterojunction according to Embodiments 3, wherein a Hallbar structure with a length of 70 μm and a width of 5 μm is fabricated by photoetching and argon ion etching, and the Hall voltage measurement channel is 2 μm wide. Then, pulse current and an external field are applied at the same time to set the in-plane exchange biases and out-of-plane exchange biases to different arrangement modes, and the height of the $R_H$-$I_x$ loop increases along with the strength of $I_x$. Therefore, by controlling the amplitude of the current pulses applied, different spin alignment states of the CoPt/CoO interface can be obtained, corresponding to different remanent Hall resistances. FIG. 3A, B show how to achieve non-volatile ten-state storage by adjusting and controlling the spin alignment of the CoPt/CoO interface at 200K temperature. The specific process is as follows:
  1. Current pulses and an external field (external field $H_x$=+100 Oe; current pulses $I_x$=+19 mA) are applied at the same time to set the magnetic state of the in-plane ferromagnetic layer to the +x direction and the magnetic moment of the interface between the perpendicular ferromagnetic layer and the perpendicular anti-ferromagnetic layer to the +z direction. This "initial" state can be restored by simply applying current pulses of $I_x$=+19 mA in the following operations, which also provides the same initial state for each write operation, as shown in FIG. 2A. The coordinate system is as shown in FIG. 1B, wherein the x direction is the length direction of the Hallbar and also the direction in which the current is applied; the y direction is the width direction of the Hallbar and also the direction in which the Hall voltage is tested; and the z direction is the sample growth direction (+z is the direction from the substrate to the film, while −z is the direction from the film to the substrate).
  2. After the external field and current pulses applied in step A are removed, as shown in FIG. 3A, the current pulses $I_x$=+19 mA are applied, and the impulse strength of the write current pulses $I_x$ is adjusted to make $I_x$ fall between −14 mA and −19 mA; then, the out-of-plane anomalous Hall curve (namely the $R_H$-$H_z$ loop, wherein $R_H$ is Hall resistance, Hz is the magnetic field along the Z direction) is measured, and a stable resistance state is obtained.

Step B is repeated nine times with varying pulse strength of the write-current pulses $I_x$ each time to obtain ten stable resistance states. These ten remanence states are used to represent 0 through 9 in decimal to achieve the non-volatile ten-state storage capability.

When step B is performed for the first time, the current pulses $I_x$=+19 mA are applied to obtain the first stable state, and then, a stable state is obtained each time when the step B is repeated. A total of ten stable states are obtained.

Such a ten-state memory can achieve electronic "write" and "read", and, what's more important, these non-volatile states are highly stable and repeatable. As shown in FIG. 3B, the remanent Hall resistances are directly obtained by applying $I_x$ of varying size, and each state is repeated 30 to 100 times. The high stability proves that large-size current pulses can change the spin alignment state of the CoPt/CoO interface effectively in a heterojunction based on the spin-orbit torque effect. Due to the exchange bias effect, the spin alignment state of the interface remains unchanged during the whole Hall effect measurement, indicating that the device has a strong ability to resist magnetic field interference.

In step A, the current pulses $I_x$ set the magnetic moment of the interface between the perpendicular ferromagnetic layer and the perpendicular anti-ferromagnetic layer to the +z direction. Therefore, after the external field and current pulses applied in step A are removed, current pulses $I_x$(−14~19 mA) in the negative direction need to be applied to set the interface magnetic moment in the perpendicular ferromagnetic layer and the perpendicular anti-ferromagnetic layer to the −z direction; the larger the current pulses $I_x$ in the negative direction are, the more interface magnetic moments in the perpendicular ferromagnetic layer and perpendicular anti-ferromagnetic layer are set to the −z direction. It can be believed that the current pulses $I_x$ in the negative direction correspond to the interface moments in the perpendicular ferromagnetic layer and the perpendicular anti-ferromagnetic layer set to the −z direction one to one; such one-to-one corresponding relations are reflected in the varying size of Hall resistances of the remanent magnetic states. For example, −14 mA current pulses can set only a few magnetic moments to the −z direction, while −19 mA current pulses can set most of the magnetic moments to the −z direction. To ensure that the starting point of the one-to-one correspondence is the same each time, +19 mA current pulses are required to be applied, as shown in FIG. 3B.

The specific process resembles the following: −14 mA current pulses are applied to obtain the corresponding hall resistance (state 1), and then +19 mA current pulses are applied to restore the initial state; then, −15 mA current pulses are applied to obtain another Hall resistance (state 2), and, after that, +19 mA current pulses are applied again to restore the initial state; then, −16 mA are applied to obtain another Hall resistance (state 3). Since +19 mA current pulses are applied each time to ensure the same starting point, the corresponding states 1, 2, and 3 can be obtained simply by applying the corresponding current. As shown in FIG. 3B, each of the 0-9 states is measured 30 or 100 times, showing good repeatability.

Embodiment 7

A method of adjusting and controlling the exchange biases in the two directions to achieve spin logic functions in the said single magnetic heterojunction according to any one of the Embodiments 1-3, wherein a Hallbar structure with a length of 70 μm and a width of 5 μm is fabricated by photoetching and argon ion etching, and the Hall voltage measurement channel is 2 μm wide, comprising steps as follows:

① A Hallbar device with two current channels but only one voltage channel is designed. The two current channels are the first channel and the second channel respectively, as shown in FIG. 4A. Two Hallbars with the same current channel width of 5 μm are connected in parallel to form a composite device, in which the exchange bias direction in each Hall channel can be manipulated independently.

The directions of in-plane exchange biases in the first and second channels can be artificially controlled in the present invention, so the exchange biases of the first and second channels can be set in opposite directions.

② Current pulses and an external field are applied at the same time to set the direction of in-plane exchange biases in the first channel; then, the same procedures are followed to set the direction of in-plane exchange biases in the second channel.

The alignment of magnetic moments in the first and second channels is controlled by controlling the directions of the in-plane exchange biases and the directions and size of the input current pulses in the first and second channels. The specific method is as follows: first, the in-plane exchange biases in the first and second channels are set to different configurations during the logical operation; then, under zero field, different current pulses are input into the first and second channels as the logical inputs, and the Hall voltage or Hall resistance of the whole device is taken as the logical output to achieve the spin logic functions.

The in-plane anti-ferromagnetic layer is IrMn and 8 nm thick; the perpendicular anti-ferromagnetic layer is CoO and 6 nm thick; the in-plane ferromagnetic layer is Co and 2 nm thick, wherein the Co has in-plane magnetic anisotropy and produces in-plane exchange biases at the IrMn/Co interface; the perpendicular ferromagnetic layer is CoPt and 3.3 nm thick, wherein the CoPt alloy has perpendicular magnetic anisotropy and produces out-of-plane exchange biases at the CoPt/CoO interface; the nonmagnetic layer is Ru and 0.8 nm thick.

To set the exchange biases in a channel, an external field $H_x=\pm 100$ Oe and current pulses $I_x=19$ mA are applied to the channel at the same time, and then the magnetic moment of the in-plane ferromagnetic layer Co can be set to the direction of the $H_x$, so does the exchange bias field between the in-plane anti-ferromagnetic layer IrMn and the in-plane ferromagnetic layer Co. During the process, because of the key role of joule heat in controlling the in-plane exchange biases, the magnetic state of the in-plane ferromagnetic layer Co in the other channel that is not applied with the current pulses and the exchange biases between the in-plane anti-ferromagnetic layer Mn and the in-plane ferromagnetic layer Co remain unchanged. As shown in FIG. 4B, if the magnetic moments of the in-plane ferromagnetic layers Co in the two current channels are arranged in opposite directions, then, under zero field, the effective interlayer exchange coupling fields felt by the perpendicular ferromagnetic layers CoPt are also opposite, resulting in the opposite (clockwise or counterclockwise) polarity of the magnetic moment flipping under the drive of the spin-orbit torque in both channels. During the logical operation, the input currents $I_1$ and $I_2$ are used as the logical inputs ($I_x=+18$ mA represents logic "1", $I_x=-18$ mA represents logic "0"), while the Hall resistances of the composite device are used as the logical outputs. During Hall resistance measurement, $I_1=I_2=0.1$ mA. It needs to be noted that the magnetic moments in the two channels can be arranged in four modes: up-up, up-down, down-up and down-down. Since the Hall resistance is proportional to the perpendicular component of the magnetic moment, both the up-down and up-down states present a hall resistance close to zero. Therefore, $R_H>0.1\Omega$ and $R_H\leq 0.1\Omega$ are defined as the "1" and "0" of the output logic.

Embodiment 8

The method of adjusting and controlling the exchange biases in the two directions to achieve spin logic functions in a single magnetic heterojunction according to Embodiment 7, provided however that:

The said single magnetic heterojunction is the one as described in Embodiment 3;

In step ②, the process of achieving the AND logic function is as follows:

Current pulses and an external field (external field $H_x=+100$ Oe; current pulses $I_x=+19$ mA) are applied at the same time in the first and second channels to set the directions of in-plane exchange biases in the first and second channels and the magnetization directions of the in-plane ferromagnetic layers to the +x direction; then, the $R_H$-$I_x$ loops in the first and second channels flip anticlockwise. When the applied current pulses $I_x=+18$ mA, the magnetic moment of the perpendicular ferromagnetic layer in every single channel is upward; conversely, it is downward when the applied current pulses $I_x=-18$ mA. When $I_1=I_2=+18$ mA, namely when both logical inputs are "1" (where: $I_1$ and $I_2$ represent the current pulses applied in the first and second channels respectively), the magnetization directions of the perpendicular ferromagnetic layers in the first and second channels are both upward, and the corresponding logical output is "1", thus achieving the AND logic function, as shown in FIG. 4C.

Embodiment 9

The method of adjusting and controlling the exchange biases in the two directions to achieve spin logic functions in a single magnetic heterojunction according to Embodiment 7, provided however that:

The said single magnetic heterojunction is the one as described in Embodiment 3;

In step ②, the process of achieving the NOR logic function is as follows:

Current pulses and an external field (external field $H_x$=−100 Oe; current pulses $I_x$=+19 mA) are applied at the same time in the first and second channels to set the directions of in-plane exchange biases in the first and second channels and the magnetization directions of the in-plane ferromagnetic layers to the −x direction; then, the $R_H$-$I_x$ loops in the first and second channels flip clockwise. When the applied current pulses $I_x$=+18 mA, the magnetic moment of the perpendicular ferromagnetic layer in every single channel is downward; conversely, it is upward when the applied current pulses $I_x$=−18 mA. When $I_1$=$I_2$=−18 mA, namely when both logical inputs are "0" (where: $I_1$ and $I_2$ represent the current pulses applied in the first and second channels respectively), the magnetization directions of the perpendicular ferromagnetic layers in the first and second channels are both upward, and the corresponding logical output is "1", thus achieving the NOR logic function, as shown in FIG. 4D.

Embodiment 10

The method of adjusting and controlling the exchange biases in the two directions to achieve spin logic functions in a single magnetic heterojunction according to Embodiment 7, provided however that:

The said single magnetic heterojunction is the one as described in Embodiment 3;

In step ②, the process of achieving the NIMP logic function is as follows:

Current pulses and an external field (external field $H_x$=+100 Oe; current pulses $I_1$=+19 mA) are applied in the first channel to set the direction of the in-plane exchange biases in the first channel and the magnetization direction of the in-plane ferromagnetic layer to the +x direction;

Current pulses and an external field (external field $H_x$=−100 Oe; current pulses $I_2$=+19 mA) are applied in the second channel to set the direction of the in-plane exchange biases in the second channel and the magnetization direction of the in-plane ferromagnetic layer to the −x direction;

Then, the $R_H$-$I_x$ loop in the first channel flips anticlockwise. When the applied current pulses $I_1$=+18 mA, the magnetic moment of the perpendicular ferromagnetic layer in the first channel is upward; conversely, it is downward when the applied current pulses $I_1$=−18 mA.

The $R_H$-$I_x$ loop in the second channel flips clockwise. When the applied current pulses $I_2$=+18 mA, the magnetic moment of the perpendicular ferromagnetic layer in the second channel is downward; conversely, it is upward when the applied current pulses $I_2$=−8 mA.

Figure 4F:
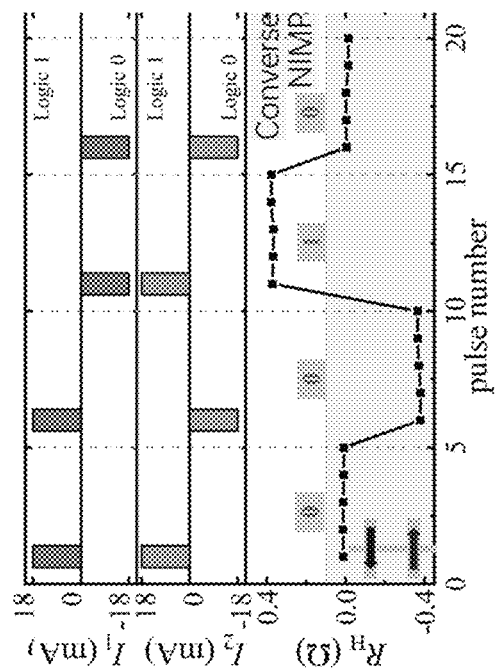
FIG. 4F is the schematic diagram of achieving logic functions through exchange bias controlling and adjusting (the Converse NIMP logic function).
Figure 4E:
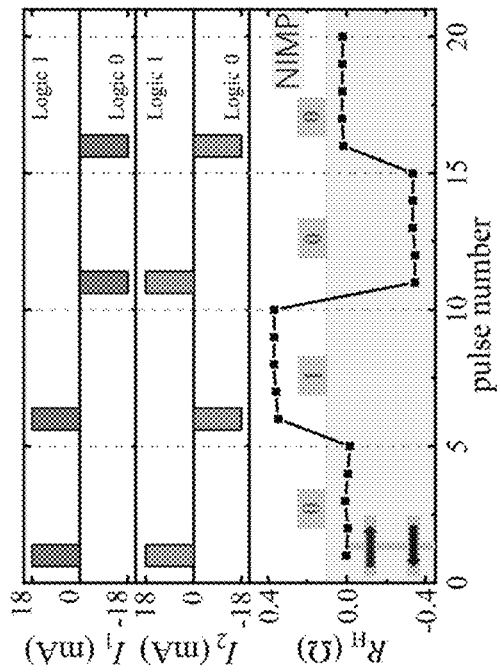
FIG. 4E is the schematic diagram of achieving logic functions through exchange bias controlling and adjusting (the NIMP logic function)

Therefore, when the input of the first channel is "1", namely $I_1$=+18 mA, and the input of the second channel is "0", namely $I_2$=−18 mA, the magnetization directions of the perpendicular ferromagnetic layers in the first and second channels are both upward, and the corresponding logical output is "1", thus achieving the NIMP logic function, as shown in FIG. 4E.

Embodiment 11

The method of adjusting and controlling the exchange biases in the two directions to achieve spin logic functions in a single magnetic heterojunction according to Embodiment 7, provided however that:

The said single magnetic heterojunction is the one as described in Embodiment 3;

In step ②, the process of achieving the Converse NIMP logic function is as follows:

Current pulses and an external field (external field $H_x$=−100 Oe; current pulses $I_1$=+19 mA) are applied in the first channel to set the direction of the in-plane exchange biases in the first channel and the magnetization direction of the in-plane ferromagnetic layer to the −x direction;

Current pulses and an external field (external field $H_x$=+100 Oe; current pulses $I_2$=+19 mA) are applied in the second channel to set the direction of in-plane exchange biases in the second channel and the magnetization direction of the in-plane ferromagnetic layer to the +x direction;

Then, the $R_H$-$I_x$ loop in the first channel flips clockwise. When the applied current pulses $I_1$=+18 mA, the magnetic moment of the perpendicular ferromagnetic layer in the first channel is downward; conversely, it is upward when the applied current pulses $I_1$=−18 mA.

The $R_H$-$I_x$ loop in the second channel flips anticlockwise. When the applied current pulses $I_2$=+18 mA, the magnetic moment of the perpendicular ferromagnetic layer in the second channel is upward; conversely, it is downward when the applied current pulses $I_2$=−18 mA.

Therefore, when the input of the first channel is "0", namely $I_1$=−18 mA, and the input of the second channel is "1", namely $I_2$=+18 mA, the magnetization directions of the perpendicular ferromagnetic layers in the first and second channels are both upward, and the corresponding logical output is "1", thus achieving the Converse NIMP logic function, as shown in FIG. 4F.

FIG. 4A-F is the schematic diagram of achieving logic functions at a room temperature of 300 K by adjusting and controlling the exchange biases.

The above are the application examples of the present invention. It shall be pointed out that several improvements can be made, such as the change of the membrane structure, and the change of the Hallbar structure. However, such improvements are all based on the principle of the present invention, so they are also within the protection scope of the present invention.

What is claimed is:

1. A single magnetic heterojunction structure with both in-plane exchange bias effect and out-of-plane exchange bias effect comprising a substrate, an in-plane anti-ferromagnetic layer, an in-plane ferromagnetic layer, a nonmagnetic layer, a perpendicular ferromagnetic layer, and a perpendicular anti-ferromagnetic layer respectively from the bottom up; the in-plane ferromagnetic layer and the perpendicular ferromagnetic layer are coupled together through the nonmagnetic layer in the middle; the in-plane exchange bias effect occurs between the in-plane ferromagnetic layer and the in-plane anti-ferromagnetic layer as a result of the interfacial exchange coupling between the in-plane ferromagnetic layer and the in-plane anti-ferromagnetic layer, and the out-of-plane exchange bias effect occurs between the perpendicular ferromagnetic layer and the perpendicular anti-ferromagnetic layer as a result of the interfacial exchange coupling between the perpendicular ferromagnetic layer and the perpendicular anti-ferromagnetic layer.

2. The single magnetic heterojunction structure with both in-plane exchange bias effect and out-of-plane exchange bias effect according to claim 1, wherein the in-plane anti-ferromagnetic layer is any one of the antiferromagnetic materials IrMn, PtMn, PdMn, FeMn, CrMn, NiMn, NiO, CoO, MnO, FeO, and $Fe_2O_3$; the perpendicular anti-ferromagnetic layer is any one of the antiferromagnetic materials IrMn, PtMn, PdMn, FeMn, CrMn, NiMn, NiO, CoO, MnO, FeO, and $Fe_2O_3$; the in-plane ferromagnetic layer is ferromagnetic material with in-plane magnetic anisotropy and is any one of Co, Fe, Ni, CoFe, CoFeB, CoNi, NiFe, CoPt, CoTb, and FePt; the perpendicular ferromagnetic layer is the ferromagnetic material with perpendicular magnetic anisotropy and is any one of Co, Fe, Ni, CoFe, CoFeB, CoNi, NiFe, CoPt, CoTb, and FePt; the nonmagnetic layer is any one of Ta, Ru, Gd, Ti, W, Cr, Cu, Hf, Mo, Pd, Au, and Pt.

3. The single magnetic heterojunction structure with both in-plane exchange bias effect and out-of-plane exchange bias effect according to claim 1, wherein the in-plane anti-ferromagnetic layer is 1-20 nm thick; the perpendicular anti-ferromagnetic layer is 1-20 nm thick; the in-plane ferromagnetic layer is 0.5-10 nm thick; the perpendicular ferromagnetic layer is 0.5-10 nm thick; the nonmagnetic layer is 0.3-3 nm thick.

4. A method of adjusting and controlling the exchange biases in the two directions to achieve multiple-state storage capability in the single magnetic heterojunction structure according to claim 1, comprising the following steps:
(A) current pulses and an external field are applied at the same time to set the in-plane exchange bias to a particular direction;
(B) only current pulses are applied to adjust and control the perpendicular exchange bias through the spin-orbit torque effect without changing the direction of the in-plane exchange bias to achieve multiple-state storage; the specific method is as follows: the spin arrangement mode of the interface between the perpendicular ferromagnetic layer and the perpendicular anti-ferromagnetic layer is adjusted and controlled through the amplitude control of the current pulses applied; different spin arrangement modes are associated to different Hall resistance values, and different Hall resistance states is used to store different information, thus achieving multiple-state storage capability.

5. The method of adjusting and controlling the exchange biases in the two directions to achieve multiple-state storage capability according to claim 4, wherein:
in the step (A), the value range of the external field $H_x$ is $-1000 \text{ Oe} < H_x < -50 \text{ Oe}$ and $+50 \text{ Oe} < H_x < +1000 \text{ Oe}$; the value range of the pulse current $I_x$ is $-20 \text{ mA} < I_x < -10 \text{ mA}$ and $+10 \text{ mA} < H_x < +20 \text{ mA}$, and the pulse current density is $10^6$-$10^7$ $A/cm^2$; both $H_x$ and $I_x$ are set along the length direction of the Hall bar;
the in-plane exchange bias and out-of-plane exchange bias are set to different arrangement modes under the combined action of an external field and pulse current to achieve non-volatile ten-state storage capability; which is as follows:
i) current pulses and an external field (external field $H_x$=+100 Oe; current pulses $I_x$=+19 mA) are applied at the same time to set the magnetic state of the in-plane ferromagnetic layer to the +x direction and the magnetic moment of the interface between the perpendicular ferromagnetic layer and the perpendicular anti-ferromagnetic layer to the +z direction, wherein the x direction is the length direction of the Hall bar and also the direction in which the current is applied; the y direction is the width direction of the Hall bar and also the direction in which the Hall voltage is tested; the z direction is the sample growth direction; and
ii). after the external field and current pulses applied in the step i) are removed, the current pulses $I_x$=+19 mA are applied, and the impulse strength of the write current pulses $I_x$ is adjusted to make $I_x$ fall between −14 mA and −19 mA; then, the out-of-plane anomalous Hall curve is measured, and a stable resistance state is obtained;
the step ii) is repeated nine times with varying pulse strength of the write-current pulses $I_x$ each time to obtain ten stable resistance states; these ten remanence states are used to represent 0 through 9 in decimal to achieve the non-volatile ten-state storage capability.

6. A method of adjusting and controlling the exchange biases in the two directions to achieve spin logic functions in the single magnetic heterojunction structure according to claim 1 comprising the following steps:
i) a Hall bar device with two current channels but only one voltage channel is designed, the two current channels are a first channel and a second channel;
ii) current pulses and an external field are applied at the same time to set the direction of in-plane exchange bias in the first channel; then, the same procedures are followed to set the in-plane exchange bias in the second channel;
the alignment of magnetic moments in the first and second channels are controlled by controlling the directions of in-plane exchange biases and the directions and size of the input current pulses in the first and second channels, which is as follows: first, the in-plane exchange bias in the first and second channels are set to different configurations during the logical operation; then, under zero field, different current pulses are input into the first and second channels as the logical inputs, and the Hall voltage or Hall resistance of the whole device is taken as the logical output to achieve the spin logic functions.

7. The method of adjusting and controlling the exchange biases in the two directions to achieve spin logic functions according to claim 6, wherein in the step ii), a process of achieving a AND logic function is as the followings:
current pulses and an external field (external field $H_x$=+100 Oe; current pulses $I_x$=+19 mA) are applied at the same time in the first and second channels to set the directions of in-plane exchange biases in the first and second channels and the magnetization directions of the in-plane ferromagnetic layers to the +x direction; then, the $R_H$-$I_x$ loops in the first and second channels flip anticlockwise; when the applied current pulses $I_x$=+18 mA, the magnetic moment of the perpendicular ferromagnetic layer in every single channel is upward; conversely, it is downward when the applied current pulses $I_x$=−18 mA. When $I_1$=$I_2$=+18 mA, namely when both logical inputs are "1" (where: $I_1$ and $I_2$ represent the current pulses applied in the first and second channels respectively), the magnetization directions of the perpendicular ferromagnetic layers in the first and second channels are both upward, and the corresponding logical output is "1", thus achieving the AND logic function.

8. The method of adjusting and controlling the exchange biases in the two directions to achieve spin logic functions according to claim 6, wherein in the step ii), a process of achieving a NOR logic function is as followings:

current pulses and an external field (external field $H_x=-100$ Oe; current pulses $I_x=+19$ mA) are applied at the same time in the first and second channels to set the directions of in-plane exchange biases in the first and second channels and the magnetization directions of the in-plane ferromagnetic layers to the −x direction; then, the $R_H$-$I_x$ loops in the first and second channels flip clockwise; when the applied current pulses $I_x=+18$ mA, the magnetic moment of the perpendicular ferromagnetic layer in every single channel is downward; conversely, it is upward when the applied current pulses $I_x=-18$ mA, When $I_1=I_2=-18$ mA, namely when both logical inputs are "0" (where: $I_1$ and $I_2$ represent the current pulses applied in the first and second channels respectively), the magnetization directions of the perpendicular ferromagnetic layers in the first and second channels are both upward, and the corresponding logical output is "1", thus achieving the NOR logic function.

9. The method of adjusting and controlling the exchange biases in the two directions to achieve spin logic functions according to claim 6, wherein in step ii) a process of achieving a NIMP logic function is as followings:

current pulses and an external field (external field $H_x=+100$ Oe; current pulses $I_1=+19$ mA) are applied in the first channel to set the direction of in-plane exchange biases in the first channel and the magnetization direction of the in-plane ferromagnetic layer to the +x direction;

current pulses and an external field (external field $H_x=-100$ Oe; current pulses $I_2=+19$ mA) are applied in the second channel to set the direction of in-plane exchange biases in the second channel and the magnetization direction of the in-plane ferromagnetic layer to the −x direction;

then, the $R_H$-$I_x$ loop in the first channel flips anticlockwise; when the applied current pulses $I_1=+18$ mA, the magnetic moment of the perpendicular ferromagnetic layer in the first channel is upward; conversely, it is downward when the applied current pulses $I_1=-18$ mA;

the $R_H$-$I_x$ loop in the second channel flips clockwise; when the applied current pulses $I_2=+18$ mA, the magnetic moment of the perpendicular ferromagnetic layer in the second channel is downward; conversely, it is upward when the applied current pulses $I_2=-18$ mA;

therefore, when the input of the first channel is "1", namely $I_1=+18$ mA, and the input of the second channel is "0", namely $I_2=-18$ mA, the magnetization directions of the perpendicular ferromagnetic layers in the first and second channels are both upward, and the corresponding logical output is "1", thus achieving the NIMP logic function.

10. The method of adjusting and controlling the exchange biases in the two directions to achieve spin logic functions according to claim 6, wherein in the step ii), a process of achieving a Converse NIMP logic function is as followings:

current pulses and an external field (external field $H_x=-100$ Oe; current pulses $I_1=+19$ mA) are applied in the first channel to set the direction of in-plane exchange biases in the first channel and the magnetization direction of the in-plane ferromagnetic layer to the −x direction;

current pulses and an external field (external field $H_x=+100$ Oe; current pulses $I_2=+19$ mA) are applied in the second channel to set the direction of in-plane exchange biases in the second channel and the magnetization direction of the in-plane ferromagnetic layer to the +x direction;

then, the $R_H$-$I_x$ loop in the first channel flips clockwise; when the applied current pulses $I_1=+18$ mA, the magnetic moment of the perpendicular ferromagnetic layer in the first channel is downward; conversely, it is upward when the applied current pulses $I_1=-18$ mA;

the $R_H$-$I_x$ loop in the second channel flips anticlockwise; when the applied current pulses $I_2=+18$ mA, the magnetic moment of the perpendicular ferromagnetic layer in the second channel is upward; conversely, it is downward when the applied current pulses $I_2=-18$ mA;

therefore, when the input of the first channel is "0", namely $I_1=-18$ mA, and the input of the second channel is "1", namely $I_2=+18$ mA, the magnetization directions of the perpendicular ferromagnetic layers in the first and second channels are both upward, and the corresponding logical output is "1", thus achieving the Converse NIMP logic function.

11. The single magnetic heterojunction structure with both in-plane exchange bias effect and out-of-plane exchange bias effect according to claim 3, wherein the in-plane anti-ferromagnetic layer is IrMn and 8 nm thick; the perpendicular anti-ferromagnetic layer is CoO and 6 nm thick; the in-plane ferromagnetic layer is Co and 2 nm thick; the perpendicular ferromagnetic layer is CoPt and 3.3 nm thick; the nonmagnetic layer is Ru and 0.8 nm thick.

12. The method of adjusting and controlling the exchange biases in the two directions to achieve multiple-state storage capability according to claim 5, wherein in the step (A), the value range of the external field $H_x$ is $-100\ \text{Oe} \leq H_x < -50\ \text{Oe}$ and $+50\ \text{Oe} < H_x \leq +100\ \text{Oe}$; the value range of the pulse current $I_x$ is $-19\ \text{mA} \leq I_x < -12\ \text{mA}$ and $+12\ \text{mA} < H_x \leq +19\ \text{mA}$.

* * * * *